United States Patent
Otsuki et al.

(10) Patent No.: US 9,559,402 B2
(45) Date of Patent: Jan. 31, 2017

(54) COMBINER INCLUDING LAND PATTERN FORMED ON PRINTED BOARD

(71) Applicant: KABUSHIKI KAISHA TOSHIBA, Minato-ku, Tokyo (JP)

(72) Inventors: Shunya Otsuki, Kawasaki Kanagawa (JP); Hiromu Itagaki, Niiza Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/425,610

(22) PCT Filed: Aug. 6, 2013

(86) PCT No.: PCT/JP2013/071265
§ 371 (c)(1),
(2) Date: Mar. 3, 2015

(87) PCT Pub. No.: WO2014/041925
PCT Pub. Date: Mar. 20, 2014

(65) Prior Publication Data
US 2015/0207199 A1    Jul. 23, 2015

(30) Foreign Application Priority Data
Sep. 14, 2012   (JP) ................................. 2012-203483

(51) Int. Cl.
*H01P 5/12*   (2006.01)
*H01P 5/00*   (2006.01)
(Continued)

(52) U.S. Cl.
CPC ................ *H01P 5/00* (2013.01); *H01P 5/187* (2013.01); *H05K 1/18* (2013.01)

(58) Field of Classification Search
CPC .............. H01P 5/00; H01P 5/187; H05K 1/18
(Continued)

(56) References Cited

U.S. PATENT DOCUMENTS 2,606,972 A * 8/1952 Scott ........................ H03G 5/20
                                                                       327/553
3,513,414 A   5/1970 Howe
(Continued)

FOREIGN PATENT DOCUMENTS

CN   101577358   11/2009
CN   101834336 A   9/2010
(Continued)

OTHER PUBLICATIONS

Notification of the First Office Action for Chinese Patent Office Application No. 201380038560.X, dated Nov. 5, 2015, 16 pages.
(Continued)

*Primary Examiner* — Robert Pascal
*Assistant Examiner* — Kimberly Glenn
(74) *Attorney, Agent, or Firm* — Knobbe, Martens, Olson & Bear LLP

(57) ABSTRACT

The combiner includes a printed board, first and second conductor plates, and first and second conductor parts. The printed board includes a hole passing from a first surface to a second surface opposite to the first surface. The first conductor plate is made of a copper plate and mounted on the first surface of the printed board to close the hole. The second conductor plate is made of a copper plate and mounted on the second surface of the printed board to close the hole. The first conductor part is opposed to the first conductor plate with a predetermined space between the first conductor part and the first conductor plate. The second conductor part is opposed to the second conductor plate with a predetermined space between the second conductor part and the second conductor plate.

2 Claims, 6 Drawing Sheets

(51) Int. Cl.
*H01P 5/18* (2006.01)
*H05K 1/18* (2006.01)

(58) Field of Classification Search
USPC .......................................................... 333/136
See application file for complete search history.

(56) References Cited

U.S. PATENT DOCUMENTS

| | | | | |
|---|---|---|---|---|
| 3,575,674 | A * | 4/1971 | Howe, Jr. | H01P 5/187 333/116 |
| 3,771,075 | A * | 11/1973 | Phelan | H01P 5/02 333/24 R |
| 4,737,740 | A * | 4/1988 | Millican | H01P 5/187 333/116 |
| 4,754,241 | A | 6/1988 | Spinner | |
| 4,882,555 | A * | 11/1989 | Wong | H01P 5/187 333/116 |
| 5,303,419 | A * | 4/1994 | Ittipiboon | H01P 5/20 333/121 |
| 8,068,796 | B2 * | 11/2011 | Wu | H01P 5/187 333/128 |
| 8,422,947 | B2 | 4/2013 | Konya | |
| 8,508,317 | B2 * | 8/2013 | Wu | H01P 1/203 333/116 |
| 2006/0044075 | A1 | 3/2006 | Storniolo et al. | |
| 2009/0231057 | A1 | 9/2009 | Sasaki | |
| 2011/0136430 | A1 | 6/2011 | Konya | |

FOREIGN PATENT DOCUMENTS

| | | |
|---|---|---|
| CN | 201898188 U | 7/2011 |
| JP | 62-114301 A | 5/1987 |
| JP | 04-321302 A | 11/1992 |
| JP | H05-114806 | 5/1993 |
| JP | 10-135717 A | 5/1998 |
| JP | 11-233703 A | 8/1999 |
| JP | 2001-251029 A | 9/2001 |
| JP | 3692662 B2 | 9/2005 |
| JP | 2007-043547 A | 2/2007 |
| WO | WO 2014/041925 A1 | 3/2014 |

OTHER PUBLICATIONS

Supplementary European Search Report dated Mar. 22, 2016 in European Application No. 13836610.9, in 9 pages.

Translation of International Search Report dated Mar. 17, 2015 for corresponding PCT Application No. PCT/JP2013/071265, in 6 pages.

International Search Report dated Nov. 12, 2013 in corresponding PCT Application No. PCT/JP2013/071265.

Office Action dated Apr. 19, 2016 of Chinese Patent Application 201380038560.X, in 11 pages.

* cited by examiner

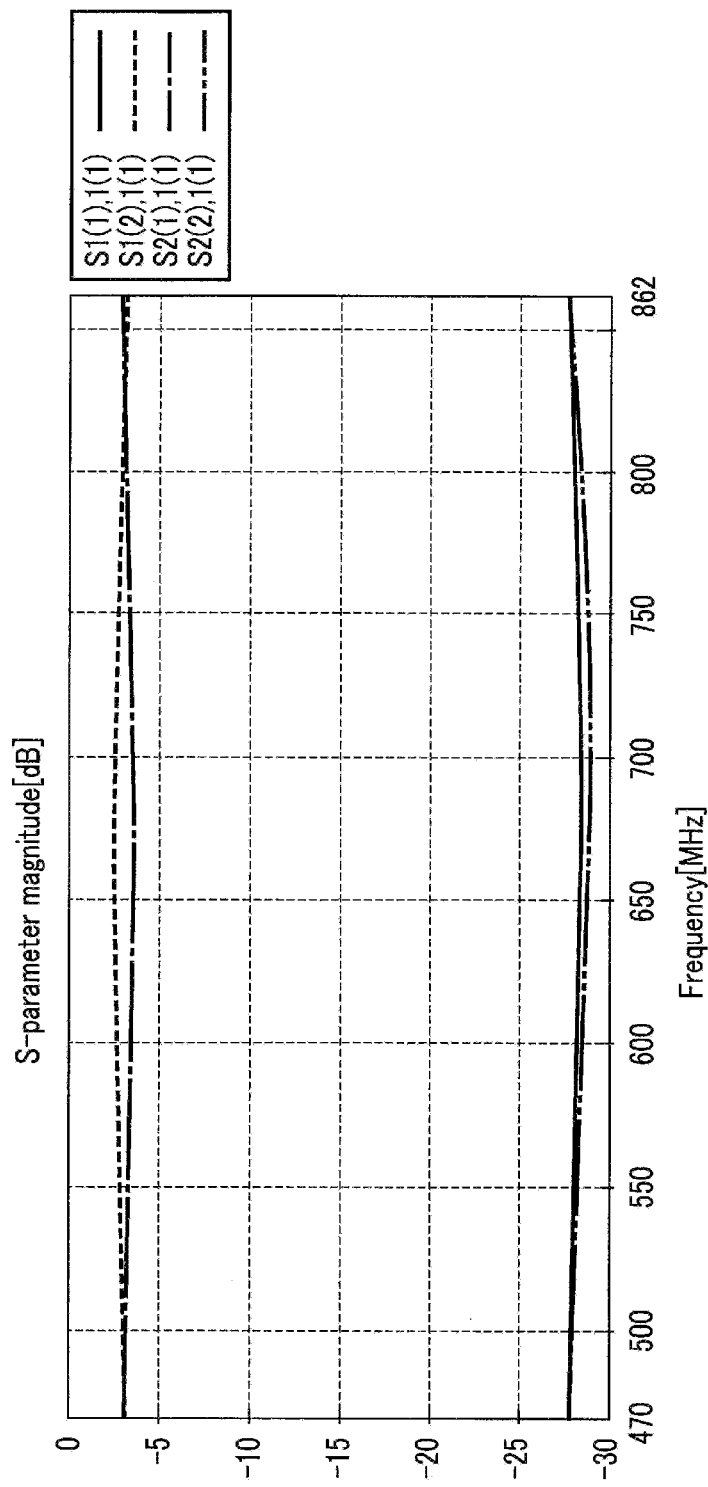
F I G. 3

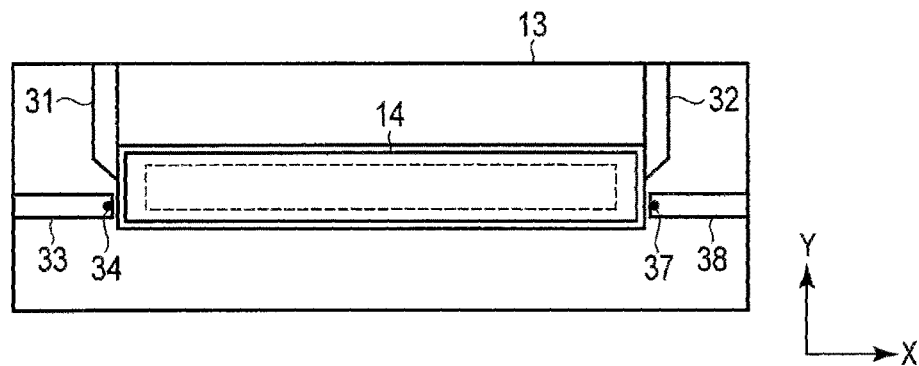
F I G. 7
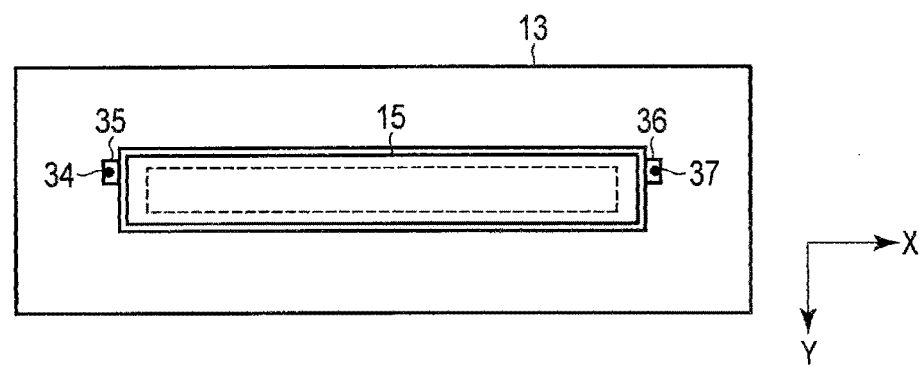
F I G. 8
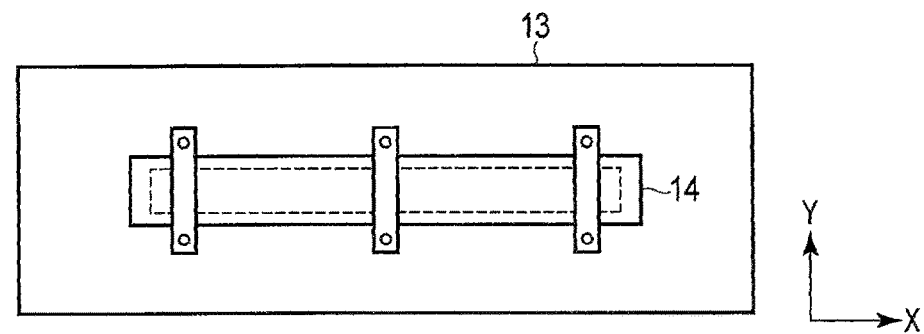
F I G. 9

COMBINER INCLUDING LAND PATTERN FORMED ON PRINTED BOARD

CROSS-REFERENCE TO RELATED APPLICATION

This is a U.S. national phase application under 35 U.S.C. §371 of International Application PCT/JP2013/071265, filed Aug. 6, 2013.

FIELD

Embodiments of the present invention relate to a combiner including a printed board.

BACKGROUND

For a high-power amplifier used in a terrestrial digital transmitter, a combiner having a high degree of coupling, such as a 3 dB combiner, is used. When this type of combiner is produced using a printed board, the combiner is of a broadside coupling type utilizing a microstrip line.

However, in the broadside coupling type combiner, the effective relative permittivity of an odd mode is larger than that of an even mode, and the phase velocity of the odd mode is lower than that of the even mode. Therefore, a circuit impedance Z, an even mode impedance $Z_e$ and an odd mode impedance $Z_o$ do not satisfy the relationship expressed by $Z^2=Z_e Z_o$ in a coupler structure. The coupler structure not satisfying the relationship of $Z^2=Z_e Z_o$ increases a return loss, and degrades isolation.

CITATION LIST

Patent Literatures

Patent Literature 1: Jpn. Pat. Appln. KOKAI Publication No. 5-114806

SUMMARY OF THE INVENTION

Technical Problem

As described above, a conventional broadside coupling type combiner may increase a return loss and degrade isolation because the effective relative permittivity of the odd mode is larger than that of the even mode.

A purpose is to provide a combiner capable of approximating the effective relative permittivity of the odd mode to that of the even mode and preventing an increase in return loss and a degradation of isolation.

Solution to Problem

According to an embodiment, a combiner comprises a printed board, first and second conductor plates, and first and second conductor parts. The printed board includes a hole passing from a first surface to a second surface opposite to the first surface. The first conductor plate is made of a copper plate and mounted on the first surface of the printed board to close the hole. The second conductor plate is made of a copper plate and mounted on the second surface of the printed board to close the hole. The first conductor part is opposed to the first conductor plate with a predetermined space between the first conductor part and the first conductor plate. The second conductor part is opposed to the second conductor plate with a predetermined space between the second conductor part and the second conductor plate.

BRIEF DESCRIPTION OF THE DRAWINGS

FIG. 3 shows a simulation result showing characteristics of the combiner shown in FIG. 1.

FIG. 7 is a diagram of the combiner shown in FIG. 6 seen from above.

FIG. 8 is a diagram of the combiner shown in FIG. 6 seen from below.

FIG. 9 shows another mounting example of a first copper plate to a printed board.

DETAILED DESCRIPTION

Hereinafter, an embodiment will be described with reference to the drawings.

Figure 1:
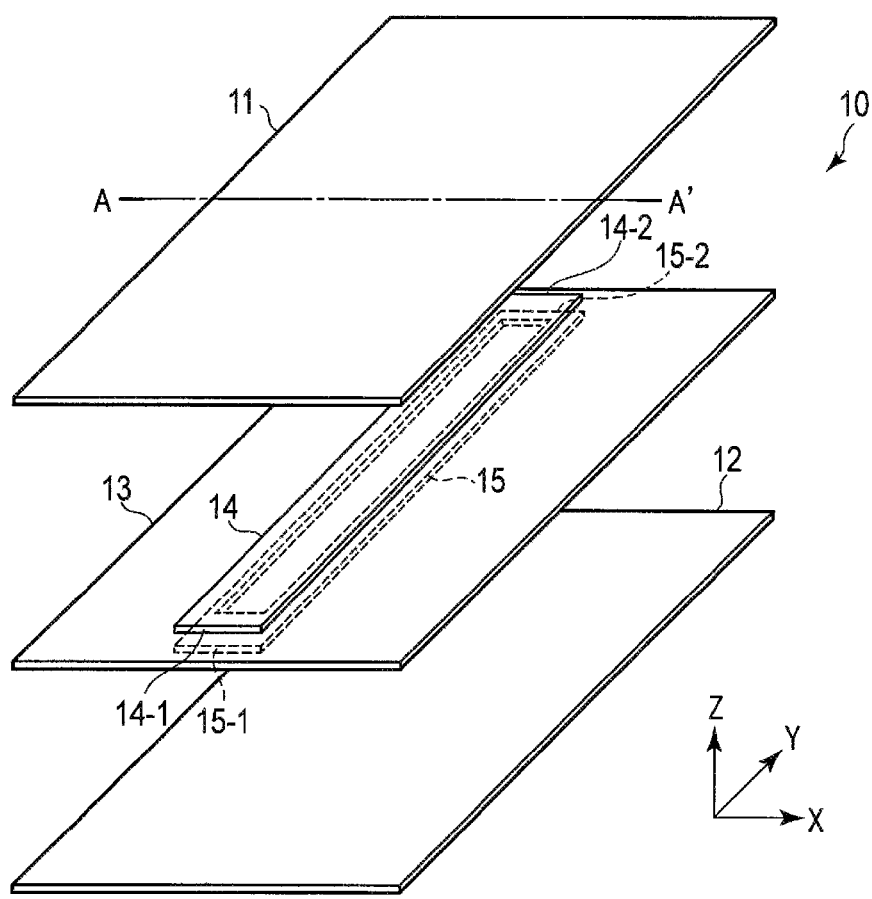
FIG. 1 shows a configuration of a combiner according to the present embodiment.
Figure 2:
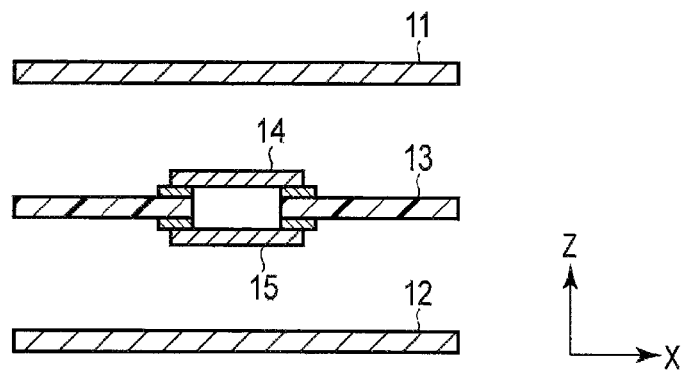
FIG. 2 is a cross-sectional view of the combiner shown in FIG. 1 taken along line A-A'.

FIG. 1 is a schematic diagram showing a configuration of a combiner 10 according to the present embodiment. FIG. 2 is a cross-sectional view of the combiner 10 shown in FIG. 1 taken along line A-A'. The combiner 10 shown in FIG. 1 comprises a first conductor part 11, a second conductor part 12, a printed board 13, a first copper plate 14, and a second copper plate 15.

The first conductor part 11 is located essentially parallel to and a predetermined distance apart from the first copper plate 14.

The second conductor part 12 is located essentially parallel to and a predetermined distance apart from the second copper plate 15.

The printed board 13 is provided with a hole passing through from its front surface to back surface. The hole has a rectangular form slightly smaller than a coupling line formed by the first and second copper plates 14 and 15. Namely, the hole has a predetermined x-directional length, and a y-directional length which corresponds to approximately one quarter-wavelength of a signal propagated by the first and second copper plates 14 and 15.

The first copper plate 14 is one quarter-wavelength long of a supplied signal, for example. The first copper plate 14 is mounted on the printed board 13 to close the hole formed in the printed board 13 and to be opposed to the first conductor part 11. When the first copper plate 14 is mounted, the printed board 13 is provided with a copper foil patterned land to enable surface mounting by a reflow. The land pattern is shown in FIG. 2, but omitted in FIG. 1 for simplification of the figure.

The second copper plate 15 is one quarter-wavelength long of a supplied signal, for example. The second copper plate 15 is mounted on the printed board 13 to close the hole formed in the printed board 13 and to be opposed to the second conductor part 12. When the first copper plate 14 is mounted, the printed board 13 is provided with a copper foil patterned land to enable surface mounting by a reflow. The land pattern is shown in FIG. 2, but omitted in FIG. 1 for simplification of the figure. The first and second copper plates form a coupling line.

FIG. 3 shows a simulation result showing characteristics of the combiner shown in FIG. 1. S1(1), S2(1), S1(2) and S2(2) in FIG. 3 respectively correspond to a first end 14-1 of the first copper plate 14, a second end 14-2 of the first copper plate 14, a first end 15-1 of the second copper plate 15, and a second end 15-2 of the second copper plate 15 in FIG. 1. In FIG. 3, "S1(1),1(1)" indicates a ratio of a signal output from S1(1) to a signal input from S1(1), i.e., a return loss. "S1(2),1(1)" indicates a ratio of a signal output from S1(1) to a signal input from S1(2), i.e., an insertion loss. "S2(1),1(1)" indicates a ratio of a signal output from S1(1) to a signal input from S2(1), i.e., an insertion loss. "S2(2),1(1)" indicates a ratio of a signal output from S1(1) to a signal input from S2(2), i.e., isolation.

Figure 4:
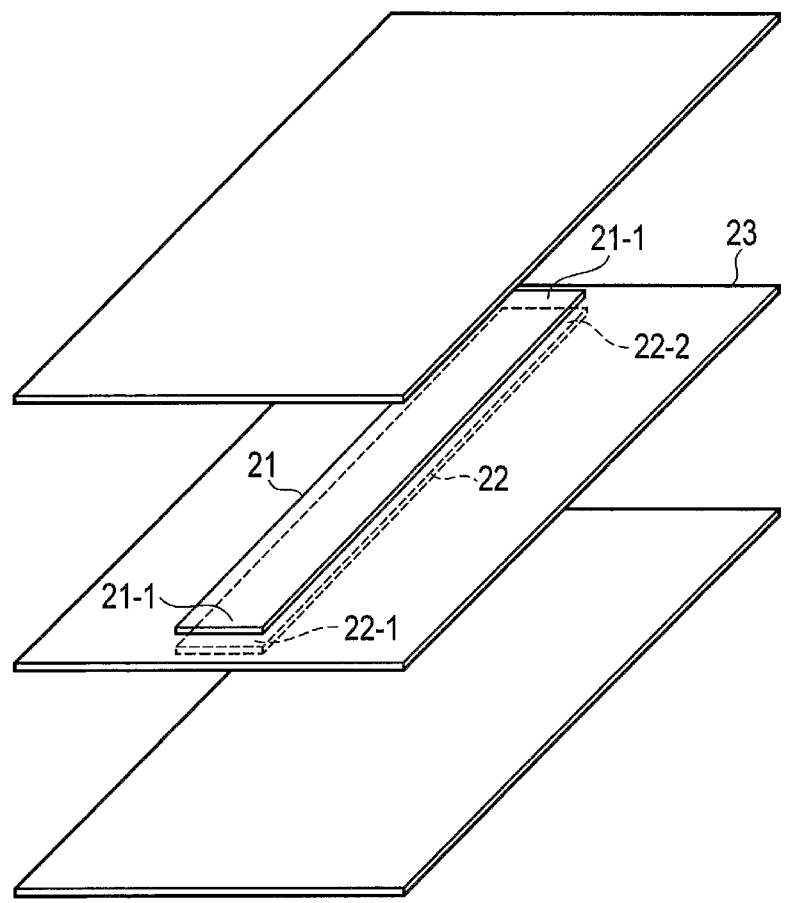
FIG. 4 shows a configuration of a conventional combiner in which a printed board includes no hole.
Figure 5:
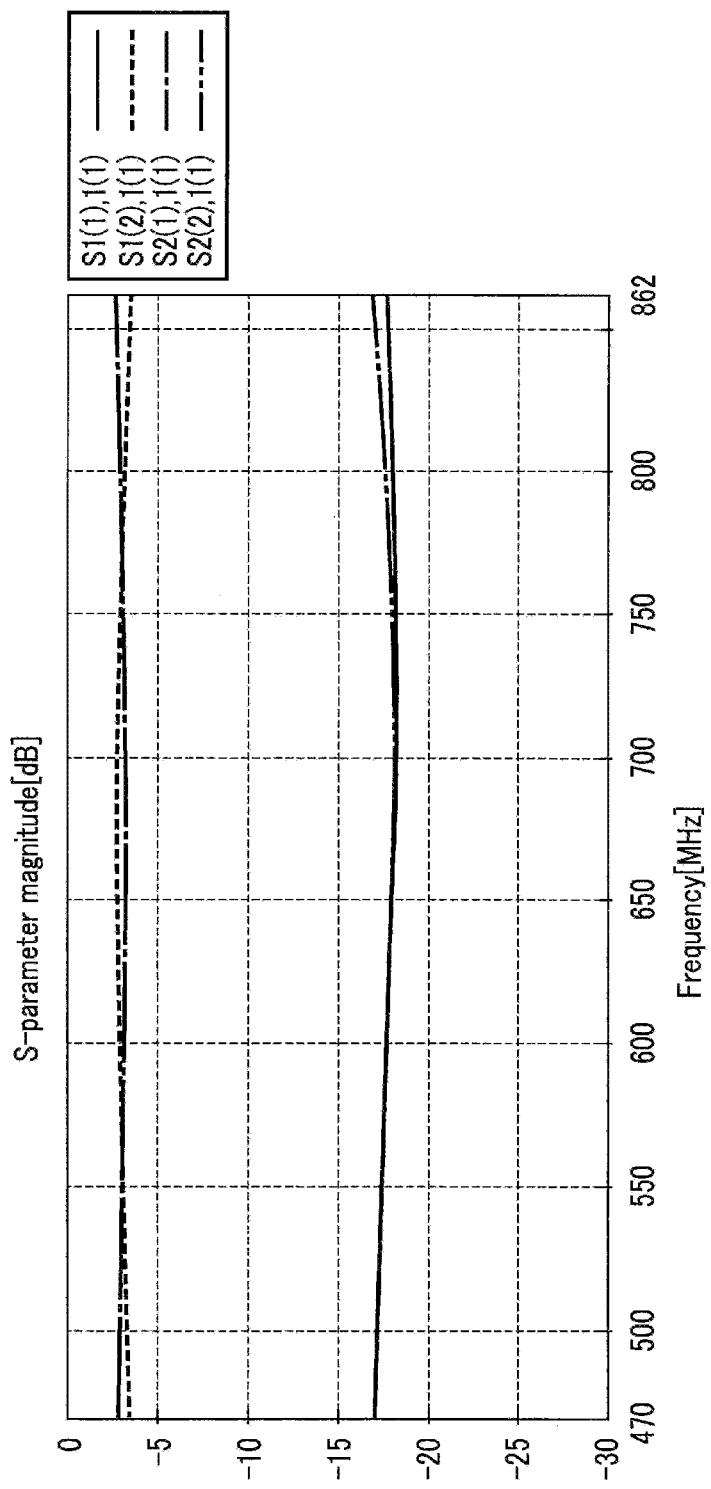
FIG. 5 shows a simulation result showing characteristics of the combiner shown in FIG. 4.

FIG. 4 is a schematic view showing a configuration of a conventional combiner in which a printed board includes no hole. FIG. 5 shows a simulation result showing characteristics of the combiner shown in FIG. 4. S1(1), S2(1), S1(2) and S2(2) in FIG. 5 respectively correspond to a first end 21-1 of a first pattern 21, a second end 21-2 of the first pattern 21, a first end 22-1 of a second pattern 22, a second end 22-2 of the second pattern 22 in FIG. 4. "S1(1),1(1)," "S1 (2),1(1)," "S2 (1),1(1)" and "S2(2),1(1)" in FIG. 5 are the same as those in FIG. 3.

According to FIGS. 3 and 5, "S1(2),1(1)" and "S2(1),1 (1)" are at similar levels in FIGS. 3 and 5; however, regarding "S1(1),1(1)" and "S2(2),1(1)," the simulation result shown in FIG. 3 shows approximately 10 dB lower levels than that in FIG. 5. This means that the return loss and isolation characteristics are improved by approximately 10 dB.

Figure 6:
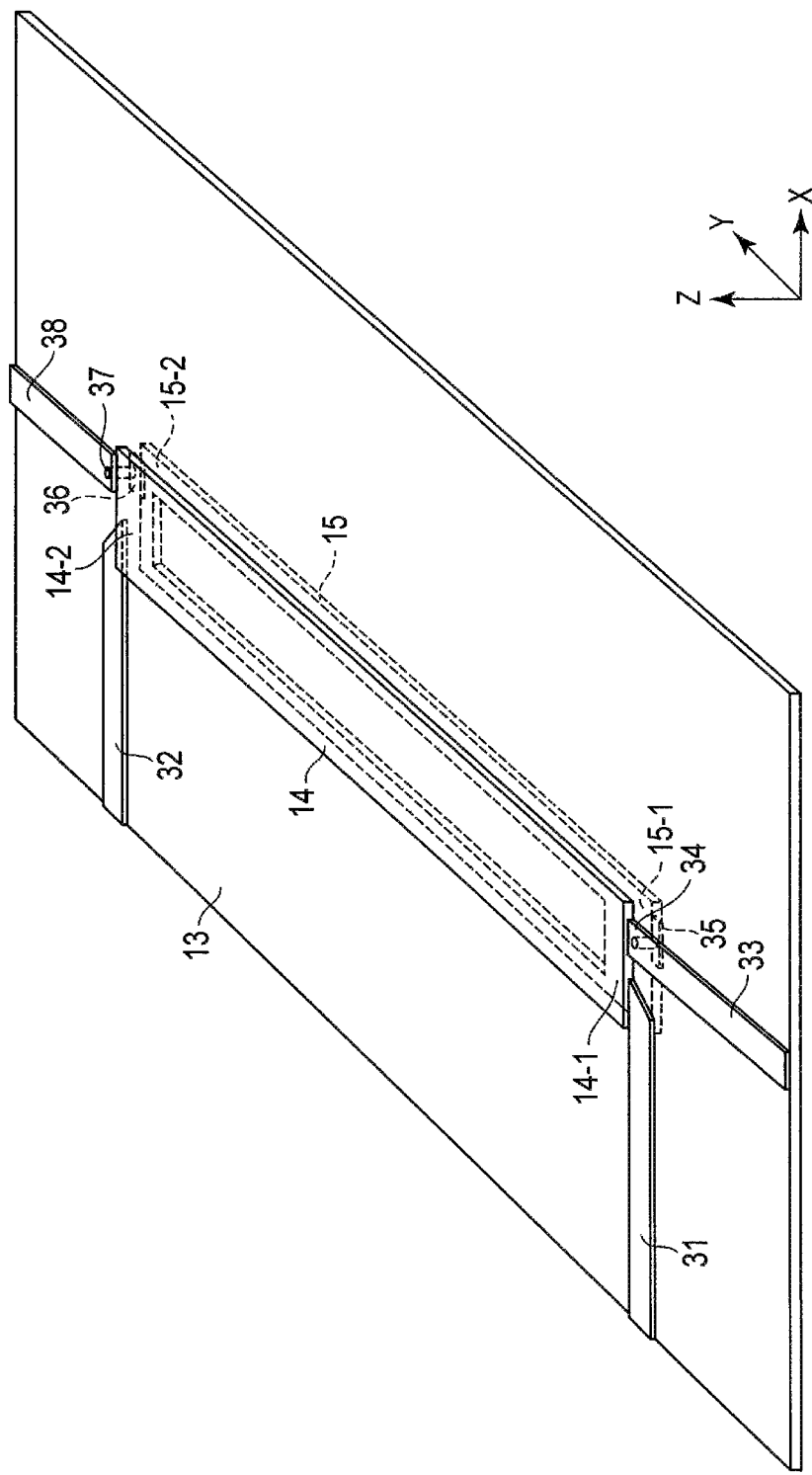
FIG. 6 shows an application example of the combiner according to the present embodiment.

FIG. 6 shows an application example of the combiner 10 according to the present embodiment. FIG. 6 shows, as an example, the case where the combiner 10 according to the present embodiment is connected to lines 31, 32, 33 and 38 of microstrip lines. In FIG. 6, ground layers of the microstrip lines, the land pattern, and the first and second conductor parts 11 and 12 are omitted for simplification of the figure. FIG. 7 is a diagram of the combiner 10 shown in FIG. 6 seen from above, and FIG. 8 is a diagram of the combiner 10 shown in FIG. 6 seen from below.

In the combiner 10 shown in FIG. 6, the first end 14-1 of the first copper plate 14 is connected to line 31, and the second end 14-2 of the first copper plate 14 is connected to line 32. The first end 15-1 of the second copper plate 15 is connected to line 35. Line 35 is connected to line 33 via through-hole 34. The second end 15-2 of the second copper plate 15 is connected to line 36. Line 36 is connected to line 38 via through-hole 37.

In FIG. 6, for example, when high-power signals are input from lines 32 and 33, the signal input from line 33 is propagated to the second copper plate 15 via through-hole 34 and line 35. In the first copper plate 14, the signal input from line 32 is combined with the signal propagated to the second copper plate 15, and a combined signal is output from line 31. The signals input from lines 32 and 33 are returned to lines 32 and 33, respectively, as a return loss.

As described above, according to the present embodiment, the printed board 13 has a hole slightly smaller than the coupling line, and the first copper plate 14 and the second copper plate 15 are surface-mounted on the printed board 13 to close the hole formed in the printed board 13. In the conventional combiner shown in FIG. 4, the printed board 23 is interposed between the first pattern 21 and the second pattern 22. Thus, some electric field components pass through the printed board in the odd mode. Consequently, the effective relative permittivity of the odd mode is larger than that of the even mode, and the phase velocity of the odd mode is lower than that of the even mode. In the present embodiment, air is between the first and second copper plates 14 and 15. Thus, no electric field component passes through the printed board. Consequently, the difference in phase velocity between the even mode and the odd mode decreases.

Therefore, the combiner 10 according to the present embodiment can approximate the effective relative permittivity of the odd mode to that of the even mode, and prevent an increase in return loss and degradation of isolation. In addition, since air is between the first and second copper plates 14 and 15, an insertion loss can be improved. The combiner 10 according to the present embodiment has a high degree of coupling like a 3 dB coupler, and is more effective when a high-power signal is input.

Moreover, in the present embodiment, a land pattern is provided on the printed board 13 when the first and second copper plates 14 and 15 are mounted. This enables surface mounting of a copper foil pattern by a reflow.

In the present embodiment, the case where a copper foil patterned land is provided around the hole of the printed board 13 to surface-mount the first and second copper plates 14 and 15 is described as an example. However, the embodiment is not limited to this case. For example, the first and second copper plates 14 and 15 may be fixed to the printed board 13 by an insulating fixation means as shown in FIG. 9.

While an embodiment has been described, this embodiment has been presented by way of example only, and is not intended to limit the scope of the inventions. Indeed, the embodiment described herein may be embodied in a variety of other forms; furthermore, various omissions, substitutions and changes in the form of the embodiment described herein may be made without departing from the spirit. The accompanying claims and their equivalents are intended to cover such forms or modifications as would fall within the scope and spirit.

REFERENCE SIGNS LIST

10: Combiner, 11: First conductor part, 12: Second conductor part, 13: Printed board, 14; First copper plate, 14-1, 15-1, 21-1, 22-1: First end, 14-2, 15-2, 21-2, 22-2: Second end, 15: Second copper plate, 21: First pattern, 22: Second pattern, 31, 32, 33, 35, 36, 38: Line, 34, 37: Through-hole

What is claimed is:

1. A combiner, comprising:
   a printed board including a hole passing from a first surface to a second surface opposite to the first surface;
   a first conductor plate made of a copper plate and mounted on the first surface of the printed board to close the hole;
   a second conductor plate made of a copper plate and mounted on the second surface of the printed board to close the hole;
   a first conductor part opposed to the first conductor plate with a predetermined space between the first conductor part and the first conductor plate; and
   a second conductor part opposed to the second conductor plate with a predetermined space between the second conductor part and the second conductor plate,
   wherein a land pattern is formed on the printed board to surround the hole.

2. The combiner of claim 1, wherein
the first and second conductor plates are one quarter-wavelength long of a supplied signal in a longitudinal direction, and
the hole is approximately one quarter-wavelength long of the signal in the longitudinal direction.

\* \* \* \* \*